(12) United States Patent
Nicholas et al.

(10) Patent No.: US 8,362,803 B2
(45) Date of Patent: Jan. 29, 2013

(54) MODE LATCHING BUFFER CIRCUIT

(75) Inventors: Peter J. Nicholas, Philadelphia, PA (US); John Christopher Kriz, Palmerton, PA (US); Dipankar Bhattacharya, Macungie, PA (US); James John Bradley, Broomfield, CO (US)

(73) Assignee: LSI Corporation, Milpitas, CA (US)

( * ) Notice: Subject to any disclaimer, the term of this patent is extended or adjusted under 35 U.S.C. 154(b) by 0 days.

(21) Appl. No.: 13/031,176

(22) Filed: Feb. 18, 2011

(65) Prior Publication Data

US 2012/0212256 A1 Aug. 23, 2012

(51) Int. Cl.
*H03K 19/0175* (2006.01)
(52) U.S. Cl. ............... 326/81; 326/68; 326/80
(58) Field of Classification Search .............. 326/62–63, 326/68, 80–81; 327/333
See application file for complete search history.

(56) References Cited

U.S. PATENT DOCUMENTS

| | | | | |
|---|---|---|---|---|
| 7,132,856 B2 * | 11/2006 | Hsu et al. | ......................... | 326/81 |
| 7,598,791 B2 * | 10/2009 | Oikawa | ......................... | 327/333 |
| 7,688,020 B2 * | 3/2010 | Kuo | ............................. | 318/696 |
| 2009/0153210 A1 | 6/2009 | Wang et al. | | |
| 2009/0256607 A1 | 10/2009 | Smith et al. | | |
| 2010/0156500 A1 * | 6/2010 | Matsubara et al. | ........... | 327/333 |

\* cited by examiner

*Primary Examiner* — Anh Tran (74) *Attorney, Agent, or Firm* — Otterstedt, Ellenbogen & Kammer, LLP (57) ABSTRACT

A voltage translator circuit includes an input stage adapted for receiving an input signal referenced to a first voltage supply, a first latch circuit adapted for connection with a second voltage supply and operative to at least temporarily store a logic state of the input signal, and a voltage clamp coupled between the input stage and the first latch circuit. The voltage clamp is operative to set a maximum voltage across the input stage to a prescribed level. The voltage translator circuit generates a first output signal at a first output formed at a junction between the first latch circuit and the voltage clamp. A second latch circuit is connected to the first output in a feedback configuration. The second latch circuit is operative to retain a logical state of the first output signal as a function of at least a first control signal supplied to the second latch circuit regardless of a state of the first voltage supply.

21 Claims, 5 Drawing Sheets

MODE LATCHING BUFFER CIRCUIT

FIELD OF THE INVENTION

The present invention relates generally to electrical and electronic circuitry, and more particularly relates to buffer circuits.

BACKGROUND OF THE INVENTION

In order to reduce costs and time to market, current integrated circuit (IC) designs often incorporate several functionalities into a single chip. This is particularly true as IC fabrication technologies move towards ultra-deep sub-micron geometries, such as, for example, 40 nanometer (nm) or 28 nm. Such a design approach is typically referred to as a system on a chip (SoC).

In order to conserve power in a SoC design, it is important that different functional blocks in the SoC be capable of being independently turned off (i.e., powered down) when they are inactive. However, with smaller feature sizes (e.g., gate oxide thickness, gate channel width and length, etc.) in current technologies, there is a significant amount of leakage current (e.g., sub-threshold leakage current) even when a functional block is powered off. In order to overcome this leakage problem, power islands are often created that supply power to individual blocks, and the power supplied to an inactive block can be selectively turned off without interfering with the overall SoC operation. This approach, however, increases layout routing congestion and design complexity, among other disadvantages.

Conventionally, when the core power supply is turned off, an input/output (I/O) buffer circuit (typically used in a SoC design for performing interfacing functions) can be forced into a limited subset of operational modes; typically, tri-state mode, weak pull-up mode, or weak pull-down mode. This can be achieved, for example, with a core power detection circuit in conjunction with a plurality of I/O level control signals. However, a full set of modes that an I/O buffer may offer during normal operation is not realizable when the core power supply to the buffer circuit is removed (i.e., turned off or otherwise disconnected).

In order to maintain proper operation of a SoC even when one or more functional blocks are powered off, it is important that I/O buffers in the powered-off blocks be able to provide a full set of functional modes as are available when power is supplied to the buffer during a normal operation thereof. One known approach to achieve this objective is to provide an I/O level signal for each core level signal. Given the number and complexity of current I/O buffers employed in a given SoC design, however, it is simply impractical to provide as many I/O level signals as there are core level signals. This approach also increases design complexity, layout routing congestion, and characterization, verification and functional model complexities, and is therefore undesirable.

SUMMARY OF THE INVENTION

Principles of the invention, in illustrative embodiments thereof, advantageously provide a buffer circuit architecture that provides full functional modes even when a core voltage supply to the buffer circuit is powered down (i.e., turned off). Moreover, the buffer circuit architecture, according to aspects of the invention, is able to provide such full functional modes using a single control signal. In this manner, the buffer circuit according to embodiments of the invention can advantageously offer a full set of functional modes even when the core voltage supply to the buffer circuit is turned off (or otherwise disconnected) without increasing design complexity, layout routing congestion, or other problems associated with conventional approaches.

In accordance with an embodiment of the invention, a voltage translator circuit includes an input stage adapted for receiving an input signal referenced to a first voltage supply, a first latch circuit adapted for connection with a second voltage supply and operative to at least temporarily store a logic state of the input signal, and a voltage clamp coupled between the input stage and the first latch circuit. The voltage clamp is operative to set a maximum voltage across the input stage to a prescribed level. The voltage translator circuit generates a first output signal at a first output formed at a junction between the first latch circuit and the voltage clamp. A second latch circuit is connected to the first output in a feedback configuration. The second latch circuit is operative to retain a logical state of the first output signal as a function of at least a first control signal supplied to the second latch circuit regardless of a state of the first voltage supply.

In accordance with another embodiment of the invention, a buffer circuit includes multiple voltage translator circuits operative to receive respective input signals referenced to a first voltage supply and to generate corresponding first output signals referenced to a second voltage supply for powering the buffer circuit. Each of the voltage translator circuits includes at least one latch circuit operative to retain a logical state of the first output signal generated by the voltage translator circuit as a function of at least a first control signal supplied to the voltage translator circuit regardless of a state of the first voltage supply. The buffer circuit further includes logic circuitry coupled with the plurality of voltage translator circuits, the logic circuitry being operative to receive the first output signals generated by the respective voltage translator circuits and to set an operational mode of the buffer circuit as a function of respective logical states of the first output signals. An output stage included in the buffer circuit is adapted for connection between the logic circuitry and an input/output pad. The output stage is operative to receive at least a second control signal generated by the logic circuitry and to generate a second output signal as a function of the second control signal for driving the input/output pad.

These and other features, objects and advantages of the present invention will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals indicate corresponding elements throughout the several views, and wherein.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION OF THE INVENTION

Principles of the present invention will be described herein in the context of illustrative I/O buffer circuits and voltage translator circuits. It should be understood, however, that the present invention is not limited to these or any other particular circuit arrangements. Rather, embodiments of the invention are more generally applicable to a buffer circuit architecture which offers full functional modes of the buffer circuit even when a core voltage supply to the buffer circuit is powered down or otherwise disconnected from the buffer circuit. A buffer circuit according to aspects of the invention is able to provide full functional modes when the core voltage supply is powered down using a substantially reduced set of control signals, thereby beneficially eliminating various disadvantages of standard approaches, including, but not limited to, layout routing congestion and design complexity. Moreover, it will become apparent to those skilled in the art given the teachings herein that numerous modifications can be made to the embodiments shown that are within the scope of the present invention. That is, no limitations with respect to the specific embodiments described herein are intended or should be inferred.

Although implementations of the present invention are described herein with specific reference to p-channel metal-oxide-semiconductor (PMOS) and n-channel metal-oxide-semiconductor (NMOS) transistor devices, as may be formed using a complementary metal-oxide-semiconductor (CMOS) fabrication process, it is to be appreciated that the invention is not limited to such transistor devices and/or such a fabrication process, and that other suitable devices, such as, for example, bipolar junction transistors (BJTs), etc., and/or fabrication processes (e.g., bipolar, BiCMOS, etc.), may be similarly employed with or without modification to the illustrative circuits described herein, as will be understood by those skilled in the art. Moreover, although preferred embodiments of the invention are typically fabricated in a silicon wafer, embodiments of the invention can alternatively be fabricated in wafers comprising other materials, including but not limited to Gallium Arsenide (GaAs), Indium Phosphide (InP), etc.

As will be appreciated by the skilled artisan, a field-effect-transistor (FET) comprises a gate oxide, which is an insulating layer between a gate and a channel region of the transistor. When used in digital logic applications, FETs are often fabricated with what is referred to as a core gate oxide, which, in recent IC fabrication technologies, is typically a very thin gate oxide, such as, for example, about 2 nanometers (nm) or less. Core or thin gate oxide transistors are typically capable of supporting, without damage, only relatively low voltages (e.g., core level voltages), for example, about 1.2 volts (V) or less. A transistor comprising a core gate oxide is often referred to as a core transistor and supports core voltage levels. For example, an illustrative core transistor device has a gate oxide thickness of about 12 Angstrom (1.2 nm) and can support voltage levels ranging from about 0 volts to about 0.945 volts across any two terminals of the device without sustaining measurable damage.

In certain applications, including, for example, some input/output (I/O) buffer and analog applications, transistors capable of supporting, without damage, higher voltages (e.g., I/O level voltages), for example, about 1.98, 3.63 or 5.5 volts, are required. A transistor capable of supporting these relatively higher I/O level voltages is typically fabricated having what is typically referred to as a thick gate oxide which, in recent technologies, may include devices having gate oxide thicknesses of, for example, about 2.3 nm or greater, and can support voltage levels ranging from about 0 volts to about 1.98 volts. A transistor comprising a thick gate oxide is often referred to as a thick oxide transistor and supports higher I/O voltage levels. Generally, the higher the supported voltage, the thicker the gate oxide that is required. Many IC fabrication processes provide both core transistors and thick oxide transistors.

The maximum voltage associated with a given transistor may be defined as the voltage that the transistor is designed to tolerate without sustaining damage over the intended lifetime of the transistor. Damage to a transistor may be manifested by gate oxide breakdown, substantial increase in gate oxide leakage current, and/or substantial change in a core transistor characteristic, for example, threshold voltage or transconductance. Core transistors are often used in core digital logic circuitry. Thick oxide transistors are often used for input, output and I/O buffers and analog applications, and are therefore sometimes referred to as I/O transistors.

Figure 1:
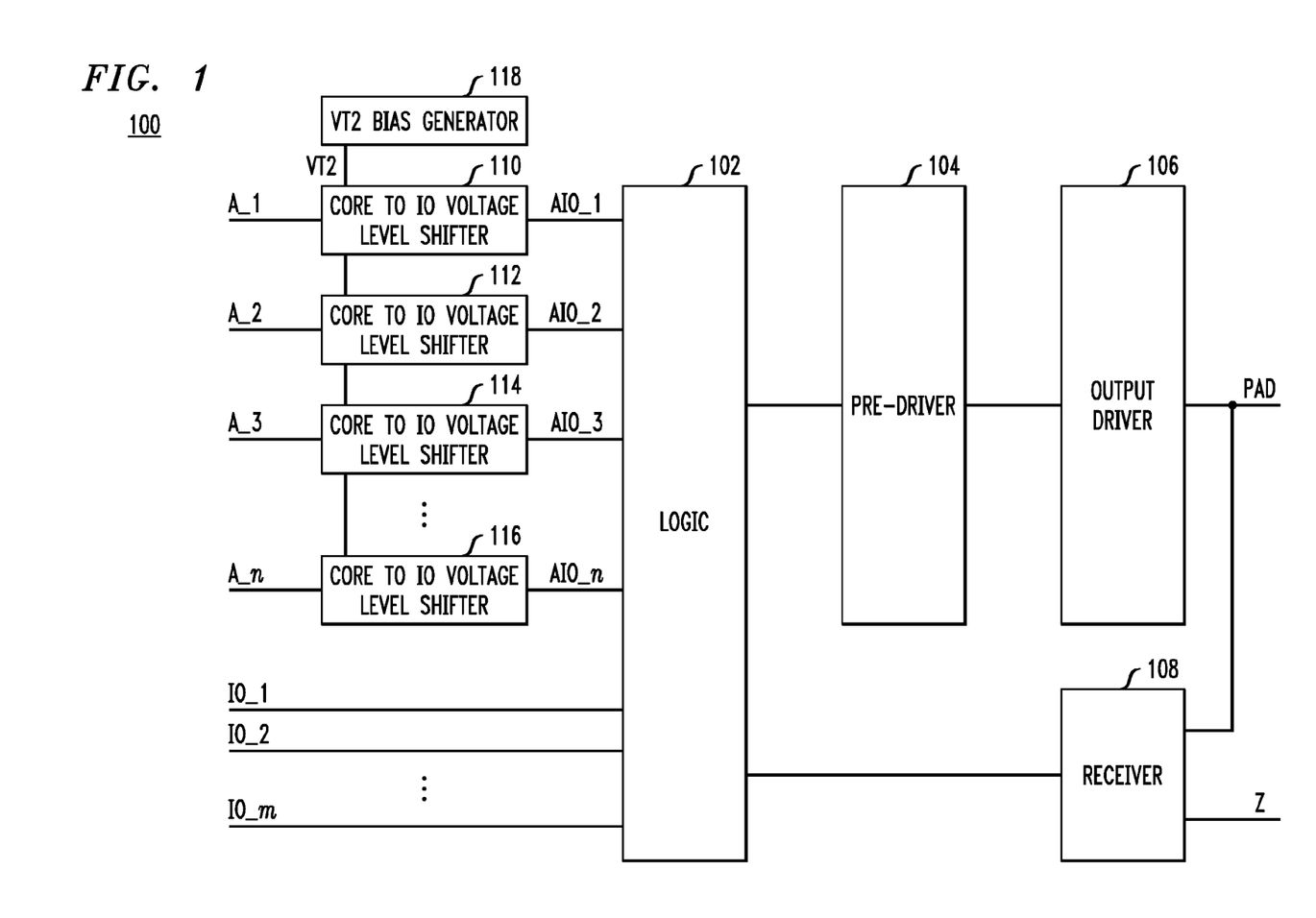
FIG. 1 is a block diagram depicting an illustrative I/O buffer which may be modified to implement aspects of the present invention.

FIG. 1 is a block diagram depicting an illustrative I/O buffer 100 which may be modified to implement aspects of the present invention. The I/O buffer 100 may include logic circuitry 102 operative to receive one or more bidirectional signals and one or more control signals, a pre-driver 104 coupled with the logic circuitry, an output driver 106 coupled with the pre-driver and operative to drive an I/O pad, and a receiver 108 coupled with the output driver and logic circuitry. Receiver 108 is preferably an I/O voltage level circuit that is operative to receive an input signal from the I/O pad and to generate an output signal Z indicative of a state of the input signal received from the I/O pad. At least one control signal generated by logic block 102 may be used to control one or more functions of receiver 108.

I/O buffer 100 is preferably operative to receive one or more input signals, A_i (e.g., A_1, A_2, A_3 ... A_n), where i=1, 2 ... n, and n is an integer. Signals A_i are core voltage level signals which may be generated, for example, by digital core circuitry (not explicitly shown). I/O buffer 100 is further operative to receive one or more control signals, IO_j (e.g., IO_1, IO_2 ... IO_m), where j=1, 2 ... m, and m is an integer less than n. Signals IO_j are I/O voltage level control signals which may be generated, for example, by I/O interface circuitry (not explicitly shown) and supplied to the buffer 100.

In modern ICs, core logic circuitry generally operates at a substantially lower voltage (e.g., less than about 1.2 volts) while I/O buffers generally run at a higher voltage (e.g., about 1.8 volts or greater). Consequently, transistors driven by core voltage level signals are core transistors with thinner gate oxide, and transistors which are driven by I/O voltage level signals (or any signal substantially higher than core level) are I/O transistors (i.e., thick oxide transistors) having thicker gate oxide to withstand the higher voltage levels, as previously stated. For at least this reason, I/O buffer 100 includes one or more voltage translator circuits 110, 112, 114 and 116, each voltage translator circuit being connected between logic circuitry 102 and a corresponding one of the core input signals A_1, A_2, A_3 and A_n, respectively. Each of the voltage translator circuits 110, 112, 114 and 116 is operative to receive an input signal (e.g., A_1, A_2, A_3, and A_n) referenced to core voltage levels and to generate an output signal, AIO_1, AIO_2, AIO_3, and AIO_n, respectively, referenced to I/O voltage levels that is indicative of a logical state of the corresponding core input signal. A bias generator circuit 118 connected with the voltage translator circuits 110, 112, 114 and 116 is operative to supply a reference bias voltage, VT2, to the respective voltage translator circuits.

During normal operation, when both a core voltage supply and an I/O voltage supply are powered on, the logical states of the input signals A_i preferably determine an operating mode of the buffer 100. When the core voltage supply is powered down (i.e., turned off or otherwise disconnected), the signals AIO_1, AIO_2, AIO_3 and AIO_n generated by the voltage translator circuits 110, 112, 114 and 116, respectively, will be unknown and the control signals IO_j are used to place the buffer 100 into a limited set of operating modes, such as, for example, tri-state, weak pull-up, or weak pull-down. Since the number m of control signals is substantially less than the number n of core input signals, the full set of operating modes of buffer 100 cannot be realized when the core voltage supply is powered down, which is disadvantageous.

Figure 2A:
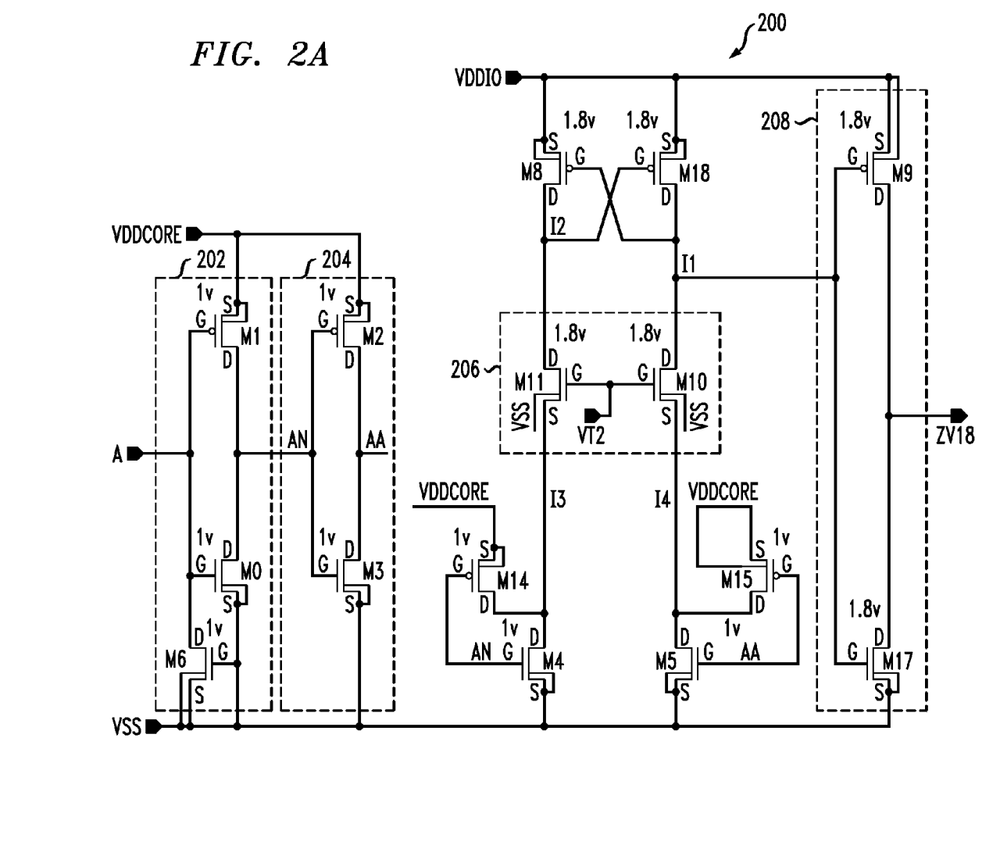
FIG. 2A is an electrical schematic diagram illustrating at least a portion of an exemplary voltage level translator circuit.

FIG. 2A is an electrical schematic diagram depicting at least a portion of an illustrative voltage translator circuit 200. The voltage translator circuit 200 can be used to translate input signals (e.g., signals AA and AN) referenced to a lower core supply voltage, which may be, for example, VDDCORE, to an output signal ZV18 which is referenced to a higher supply voltage, which may be, for example, VDDIO. In many applications, the lower core supply voltage VDDCORE is typically about 1.0 volt and the higher supply voltage VDDIO is typically about 1.8 volts. It is to be appreciated, however, that the present invention is not limited to these or to any other particular voltage levels for VDDCORE and VDDIO. Furthermore, techniques of the present invention may be similarly employed to translate an input signal referenced to the higher supply voltage VDDIO to an output signal referenced to the lower core supply voltage VDDCORE, as will be understood by those skilled in the art. One or more of the voltage translator circuits 110, 112, 114 and 116 shown in FIG. 1 may be implemented by voltage translator circuit 200.

In this and in subsequent figures, core and I/O transistors are designated by labels "1v" and "1.8v," respectively, referring to the voltage handling capabilities of the transistors. It is to be understood, however, that the voltage handling capabilities of the core transistors and/or I/O transistors are not limited to any specific voltage levels. Rather, such designations may be helpful in identifying "low voltage" and "high voltage" transistors relative to one another. Additionally, in this and subsequent figures, a bulk (or body) connection is shown for each transistor. The bulk connections of the PMOS and NMOS transistors are connected to a corresponding voltage supply (e.g., VDDCORE or VDDIO) and ground (e.g., VSS), respectively, as in a conventional manner.

Traditional mixed signal IC processes typically offer "high voltage" (e.g., I/O or thick oxide transistor) and "low voltage" (e.g., core transistor) devices. The high voltage transistor devices generally have a nominal threshold voltage of about 0.75 volts and are intended to operate with a higher power supply voltage, which may be VDDIO (e.g., about 1.8 volts). The low voltage transistor devices have a nominal threshold voltage which is substantially lower than the high voltage devices, such as, for example, about 0.35 volts, and are intended to operate with a lower core power supply voltage, which may be VDDCORE (e.g., about 1.0 volt). In order to conserve power, it is desirable that most of the core logic circuitry runs at the lower power supply voltage. The core logic circuitry typically employs low voltage transistors. However, in order to interface with other circuits external to a given IC device, at least a portion of the IC (e.g., I/O buffer circuits) is required to run at the higher power supply voltage. Thus, I/O circuitry typically employs high voltage transistors.

Input signal AN is a logical inversion of input signal A (supplied to the voltage translator circuit 200), such that when signal A is a logic high level, signal AN is a logic low level, and vice versa. Input signal AA is a buffered version of input signal A having the same logical value as signal A (and is thus a logical complement of signal AN). Signal AN may be generated, for example, by a first inverter 202 including a low voltage PMOS transistor device M1 and a low voltage NMOS transistor device M0 connected in a conventional manner. Inverter 202 is powered by the lower core supply VDDCORE and receives, as its negative supply (or voltage return), VSS. Likewise, signal AA may be generated, for example, by a second inverter 204 including a low voltage PMOS transistor device M2 and a low voltage NMOS transistor device M3 connected in a conventional fashion. Inverter 204 is powered by the lower core supply VDDCORE and receives, as its negative supply, VSS. An additional NMOS transistor device M6 is optionally included having a gate (G) and source (S) connected with VSS and a drain (D) connected with the input of inverter 202. Transistor M6 is operative to provide additional gate capacitance at the input of the first inverter 202 which may be beneficial in attenuating noise introduced at the input of the voltage translator circuit 200. Transistor M6 may also function as an electrostatic discharge (ESD) protection device.

The voltage translator circuit 200 is powered by higher supply voltage VDDIO and receives, as its negative voltage supply, VSS. The term "negative voltage supply" as used herein is intended to refer to a value of the voltage supply relative to VDDIO or VDDCORE, and does not necessarily refer to a voltage less than zero volts, although using a voltage less than zero volts is contemplated by the invention.

The voltage translator circuit 200 comprises a pair of high voltage PMOS transistor devices M8 and M18, each device having a source connected to VDDIO, and having a gate of one transistor connected with a drain of the other transistor in a cross-coupled arrangement. Specifically, the gate of transistor M8 is connected with the drain of transistor M18 at node I1, and the gate of M18 is connected with the drain of M8 at node 12. Transistors M8 and M18 are preferably operative to latch a logical state of the voltage translator circuit 200.

It is to be appreciated that, because a metal-oxide-semiconductor (MOS) device is symmetrical in nature, and thus bi-directional, the assignment of source and drain designations in the MOS device is essentially arbitrary. Therefore, the source and drain of a given MOS device may be referred to herein generally as first and second source/drain, respectively, where "source/drain" in this context denotes a source or a drain.

The voltage translator circuit 200 further comprises a pair of low voltage NMOS transistor devices M4 and M5 having gates for, receiving input signals AN and AA, respectively. Sources of transistors M4 and M5 are preferably connected with VSS, and drains of M4 and M5 are connected with the drains of transistors M8 and M18, respectively, via a voltage clamp circuit 206. Optionally, a pair of low voltage PMOS transistor devices M14 and M15 are preferably coupled with transistors M4 and M5, respectively, in a standard inverter configuration (referenced to the core voltage supply) for forming an input stage of the voltage translator circuit 200.

More particularly, sources of transistors M14 and M15 are connected with VDDCORE, a gate of M14 is connected with the gate of transistor M4 for receiving input signal AN, a drain of M14 is connected with the drain of M4 at node 13, a gate of M15 is connected with the gate of transistor M5 for receiving input signal AA, and a drain of M15 is connected with the drain of M5 at node 14.

The voltage clamp circuit 206 preferably comprises a pair of high-voltage NMOS transistor devices M10 and M11. Specifically, the drains of transistors M4 and M5 are connected with sources of transistors M11 and M10 at nodes 13 and 14, respectively. Drains of transistors M11 and M10 are connected with the drains of transistors M8 and M18 at nodes 12 and I1, respectively, and gates of M10 and M11 are connected with a reference source providing a bias voltage, VT2, for clamping the drain voltage at nodes 13 and 14 to a desired voltage level. Since transistors M4 and M5 are low voltage devices, they are generally not able to withstand the higher I/O supply voltage VDDIO. The voltage clamp circuit 206, under all prescribed process, voltage and temperature (PVT) conditions to which the voltage translator circuit 200 may be subjected, preferably provides a voltage level at nodes 13 and 14 which protects M4 and M5 from damage due to overvoltage stress.

An output stage 208 comprising high voltage PMOS transistor device M9 and high voltage NMOS transistor device M17 connected together as a standard inverter, is preferably connected with node I1 and generates an output signal ZV18 of the voltage translator circuit 200 which is indicative of the voltage at node I1. While the output signal ZV18 will, in this embodiment, be an inversion of the logical state of node I1, other output stage arrangements suitable for use with the invention are similarly contemplated (e.g., a non-inverting output stage, tri-statable output stage, etc.).

In terms of operation of the voltage translator circuit 200, when input signal AA is at a logical high level (e.g., 1.0 V), transistor M15 is turned off and transistor M5 is turned on, thereby pulling node 14 low (e.g., to about VSS or 0V). Input signal AN, being a logical complement of signal AA, will be low, thereby turning on transistor M14 and pulling node 13 high. With node 14 low, node I1 will also be low, which in turn pulls node 12 high (e.g., to about VDDIO or 1.8V) through transistor M8. Node I1 being low, output stage 208 will generate a logic high output signal ZV18 (e.g., about 1.8V). Similarly, when input signal AA is low, transistor M15 will be turned on and transistor M5 turned off, thereby pulling node 14 high (e.g., to about VDDCORE or 1.0V). Input signal AN, being a logical complement of signal AA, will be high, thereby turning on transistor M4 and pulling node 13 low. With node 13 low, node 12 will also be low, which in turn pulls node I1 high (e.g., to about VDDIO or 1.8V) through transistor M18. Node I1 being high, output stage 208 will generate a logic low output signal ZV18. When the core voltage supply VDDCORE is powered down (i.e., turned off), both transistors M4 and M5 are turned off and the output of the voltage level shifter circuit 200 will be unknown. I/O level control signals IO_j in buffer 100 shown in FIG. 1 are therefore used to set the buffer into a limited subset of functional modes, as previously explained.

Figure 2B:
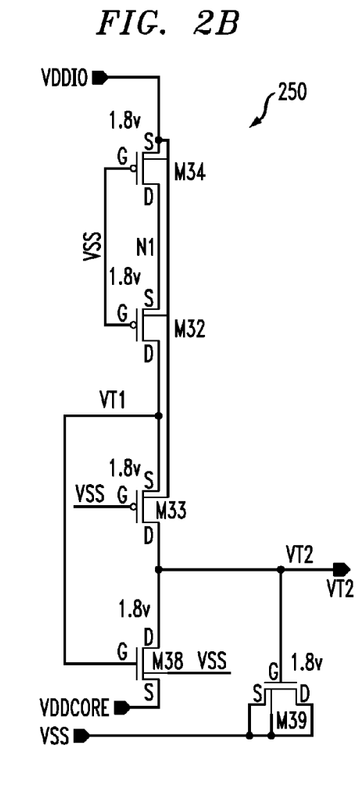
FIG. 2B is an electrical schematic diagram illustrating an exemplary bias generator circuit suitable for use in the voltage level translator circuit shown in FIG. 2A.

FIG. 2B illustrates an exemplary bias circuit 250 suitable for use with the voltage translator circuit 200 shown in FIG. 2A. The bias circuit 250 is operative for providing the bias voltage VT2 used to clamp the voltage appearing at nodes 13 and 14 of the voltage translator circuit 200. As apparent from FIG. 2B, the exemplary bias circuit 250 may be implemented using a simple voltage divider including three high voltage PMOS transistor devices, namely, M32, M33 and M34, and a high voltage NMOS transistor device, M38, arranged in a stacked configuration. Alternative voltage generation means are similarly contemplated (e.g., bandgap reference circuit, voltage multiplier, etc.). Specifically, gates of M32, M33 and M34 are connected to VSS, a source of M34 is connected to VDDIO, a drain of M34 is connected to a source of M32, a drain of M32 is connected to a source of M33, a source of M38 is connected to VDDCORE, and a gate of M38 is connected to a source of M33 at node VT1. A drain of M33 is connected to a drain of M38 and forms an output node of the bias generator circuit 250 for generating the bias voltage VT2. The value of VT2 is preferably set to one threshold voltage (of an NMOS transistor device) above the core voltage supply VDDCORE so that nodes 13 and 14 in the voltage translator circuit 200 of FIG. 2A remain at or near the core voltage.

Optionally, a high voltage NMOS transistor device M39 is included in bias circuit 250 and is connected to node VT2 as an MOS capacitor. More particularly, a source and drain of M39 are connected to VSS and a gate of M39 is connected to node VT2. The capacitance provided by M39 may be used to reduce noise which may be introduced in the bias voltage VT2. The value of this capacitance is preferably chosen as a function of the desired frequency components to be attenuated.

As previously stated, when the core voltage supply is powered off, the output signals AIO_i generated by the voltage translator circuits 110, 112, 114 and 116 in buffer 100 of FIG. 1 are unknown. I/O level control signals IO_j in buffer 100 are used to set the buffer into a limited subset of functional modes. In order to maintain the same number of functional modes in the buffer when the core voltage supply is powered off as during normal operation of the buffer (i.e., when the core voltage supply is powered on), aspects of the invention beneficially provide a buffer circuit architecture which enables the buffer circuit to retain its previous state even when the core voltage supply is powered off, thereby eliminating the need to supply an I/O level control signal IO_j for each core level input signal A_i in order to preserve the full set of functional modes of the buffer circuit.

Figure 3:
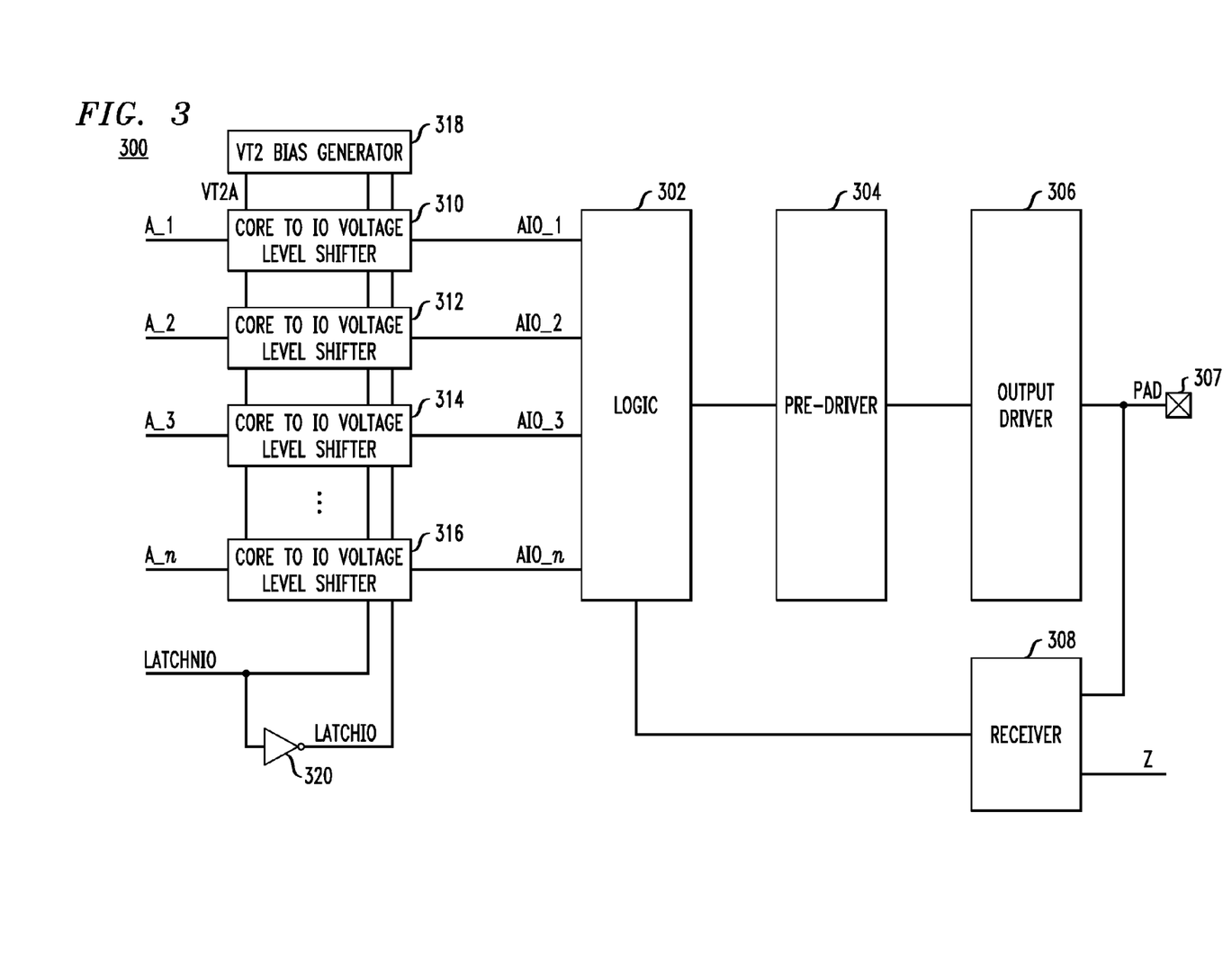
FIG. 3 is a block diagram depicting at least a portion of an exemplary I/O buffer circuit architecture, according to an embodiment of the present invention.

FIG. 3 is a block diagram depicting at least a portion of an exemplary bidirectional (e.g., I/O) buffer circuit 300, according to an embodiment of the present invention. Buffer circuit 300 preferably includes logic circuitry 302 operative to receive one or more bidirectional signals, a pre-driver 304 coupled with the logic circuitry, an output driver 306 coupled with the pre-driver and operative to drive an I/O pad (PAD) 307, and a receiver 308 coupled with the output driver and logic circuitry.

Pre-driver 304 and output driver 306 preferably form an output stage of the buffer circuit 300. Although not explicitly shown, the output stage may comprise at least a first pull-up device adapted for connection between the second voltage supply and the input/output pad 307, and at least one pull-down device adapted for connection between the input/output pad and a voltage return of the buffer circuit, which may be VSS or ground. The pre-driver 304 and output driver 306 are preferably used in at least a first mode of the buffer circuit, which may be an output buffer mode. Receiver 308 is preferably an I/O voltage level circuit that is operative, during an input mode of the buffer circuit 300, to receive an input signal from the I/O pad 307 and to generate an output signal Z indicative of a state of the input signal received from the I/O pad 307. Receiver 308 is preferably used during at least a second mode of the buffer circuit, which may be an input buffer mode. At least one control signal generated by logic block 302 may be used to control one or more functions of receiver 308.

Buffer circuit 300 is preferably operative to receive one or more input signals, A_i (e.g., A_1, A_2, A_3, A_n), where i=1, 2, ... n, and n is an integer. Signals A_i are core voltage level signals which may be generated, for example, by digital core circuitry (not explicitly shown) coupled with the buffer circuit 300. Since the logic circuitry 302 preferably utilizes I/O transistors for interfacing with output driver circuitry (e.g., pre-driver 304) referenced to the I/O voltage supply, which may be VDDIO, buffer circuit 300 preferably includes one or more voltage translator circuits 310, 312, 314 and 316, each voltage translator circuit being connected between the logic circuitry and a corresponding one of the core level input signals A_1, A_2, A_3 and A_n, respectively. Each voltage translator circuit 310, 312, 314, 316 is preferably operative to receive an input signal A_1, A_2, A_3, and A_n referenced to a core voltage supply, which may be VDDCORE, and to generate an output signal, AIO_1, AIO_2, AIO_3, and AIO_n, respectively, referenced to the I/O voltage supply VDDIO. I/O level signals AIO_i, referenced to the I/O voltage supply VDDIO, are indicative of respective logical states of the corresponding core input signals A_i, referenced to the core voltage supply VDDCORE. A bias circuit 318 connected with the voltage translator circuits 310, 312, 314 and 316 is operative to generate a reference bias voltage, VT2A, for the respective voltage translator circuits which varies as a function of one or more control signals (e.g., LATCHIO and LATCHNIO) provided to the bias circuit.

During normal operation, when both the core voltage supply VDDCORE and the I/O voltage supply VDDIO are powered on, the logical states of the input signals A_i preferably determine a functional (i.e., operating) mode of the buffer circuit 300. When the core voltage supply is powered down (i.e., turned off or otherwise disconnected), a previous state of each of the signals AIO_1, AIO_2, AIO_3 and AIO_n generated by the voltage translator circuits 310, 312, 314 and 316, respectively, is preferably retained (e.g., latched), such as, for example, by asserting an I/O voltage level control signal LATCHNIO and, optionally, a logical complement thereof, LATCHIO, (which may be generated by an inverter 320, or alternative signal generation circuitry) supplied to each of the voltage translator circuits. Thus, unlike buffer circuit 100 shown in FIG. 1, which requires a plurality of I/O voltage level control signals (IO_j) for setting the functional mode of the buffer when the core voltage supply is powered down, only a single I/O voltage level control signal, LATCHNIO (or LATCHIO, since one signal can be generated from the other), is supplied to buffer circuit 300 for providing the full set of functional modes of the buffer circuit even when the core voltage supply is powered down or otherwise disconnected, as will be described in further detail below in conjunction with FIGS. 4 and 5.

Figure 4:
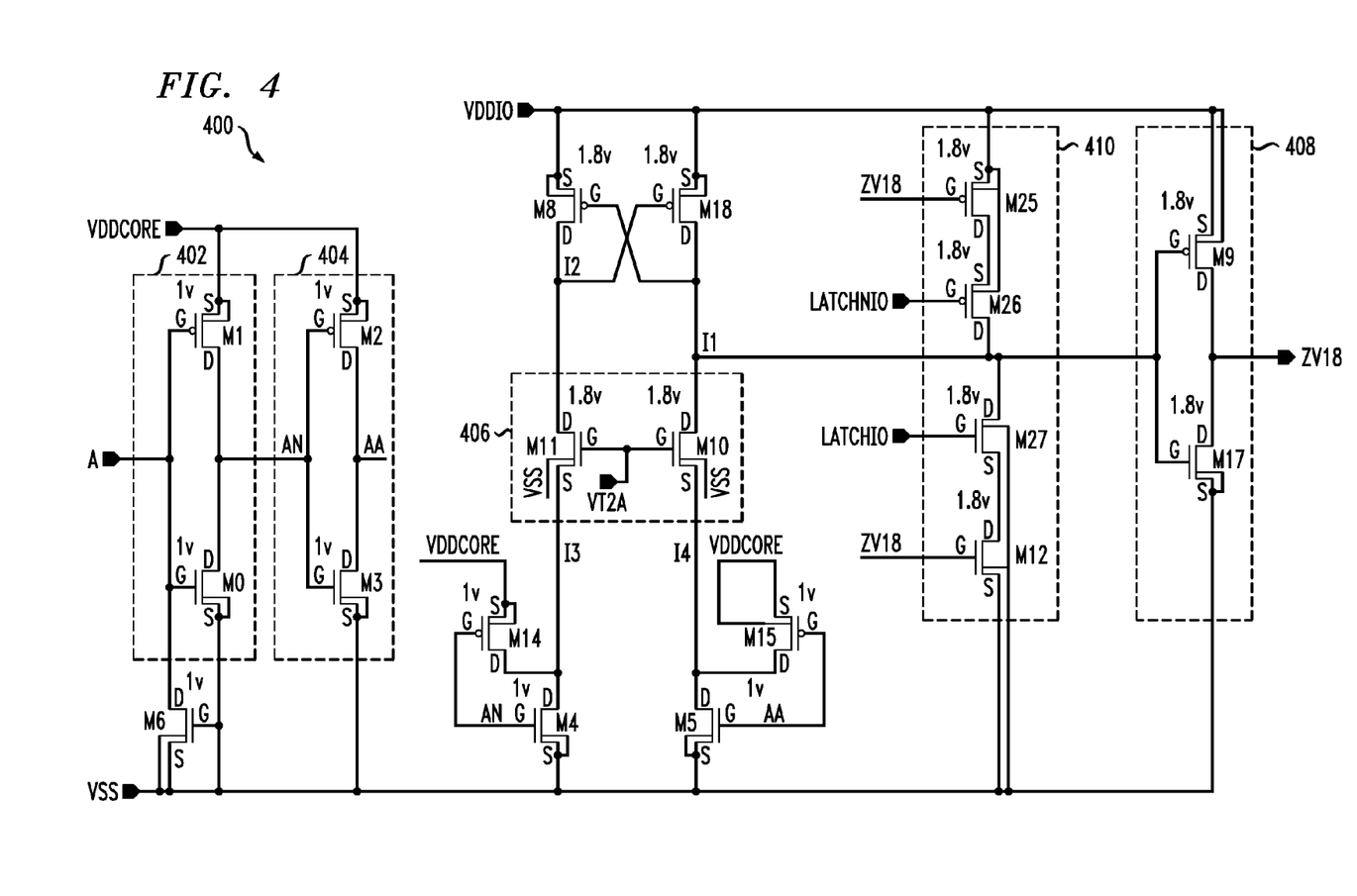
FIG. 4 is an electrical schematic diagram depicting at least a portion of an exemplary voltage level translator circuit, according to an embodiment of the present invention.

With reference now to FIG. 4, an electrical schematic diagram depicts at least a portion of an exemplary voltage translator circuit 400, according to an embodiment of the present invention. Voltage translator circuit 400, like voltage translator circuit 200 shown in FIG. 2A, can be used to translate input signals (e.g., signals AA and AN) referenced to a lower core supply voltage, which may be, for example, VDDCORE, to an output signal ZV18 referenced to a higher supply voltage, which may be, for example, VDDIO. In an illustrative embodiment, the lower core supply voltage VDDCORE is preferably about 1.0 volt and the higher supply voltage VDDIO is preferably about 1.8 volts, although the present invention is not limited to these or to any particular voltage levels for VDDCORE and VDDIO. Furthermore, techniques of the present invention may be similarly employed to translate an input signal referenced to the higher supply voltage VDDIO to an output signal referenced to the lower core supply voltage VDDCORE, as will become apparent to those skilled in the art. One or more of voltage translator circuits 310, 312, 314 and 316 shown in FIG. 3 may comprise voltage translator circuit 400.

Input signal AN is a logical inversion of input signal A (supplied to the voltage translator circuit 400), such that when signal A is a logic high level, signal AN is a logic low level, and vice versa. Input signal AA is a buffered version of input signal A having the same logical value as signal A and is a logical complement of signal AN. Signal AN may be generated, for example, by a first inverter 402 including a low voltage PMOS transistor device M1 and a low voltage NMOS transistor device M0 connected in a conventional manner. Inverter 402 is powered by the lower core supply VDDCORE and receives, as its negative supply (i.e., voltage return), VSS. As previously stated, the term "negative voltage supply" as used herein is intended to refer to a value of the voltage supply relative to VDDIO or VDDCORE, and does not necessarily refer to a voltage less than zero volts, although using a voltage less than zero volts is contemplated by the invention.

Likewise, signal AA may be generated, for example, by a second inverter 404 including a low voltage PMOS transistor device M2 and a low voltage NMOS transistor device M3 connected in a conventional fashion. Inverter 404 is powered by the lower core supply VDDCORE and receives, as its negative supply, VSS. An additional NMOS transistor device M6 is optionally included having a gate and source connected with VSS and a drain connected with the input of inverter 402. Transistor M6 is operative to provide additional gate capacitance at an input of inverter 402, which may be beneficial in attenuating noise introduced at the input of the voltage translator circuit 400. Transistor M6 may also function as an ESD protection device. Alternative means for generating the input signals AN and AA are similarly contemplated.

Voltage translator circuit 400 is preferably powered by higher (I/O) voltage supply VDDIO and receives, as its negative voltage supply, VSS. The voltage translator circuit 400 comprises a pair of high voltage PMOS transistor devices M8 and M18, each device having a source connected with VDDIO, and having a gate of one transistor connected with a drain of the other transistor in a cross-coupled configuration. Specifically, the gate of M8 is connected with the drain of M18 at node I1, and the gate of M18 is connected with the drain of M8 at node 12. Transistors M8 and M18 are preferably operative to latch a logical state of the voltage translator circuit 400.

Voltage translator circuit 400 further comprises an input stage including a pair of low voltage NMOS transistor devices M4 and M5 having gates for receiving input signals AN and AA, respectively. Sources of transistors M4 and M5 are preferably connected with VSS, and drains of M4 and M5 are connected with drains of transistors M8 and M18, respectively, via a voltage clamp circuit 406. Optionally, the input stage further includes a pair of low voltage PMOS transistor devices M14 and M15 coupled with transistors M4 and M5, respectively, in a standard inverter configuration that is referenced to the core voltage supply VDDCORE. More particularly, sources of transistors M14 and M15 are connected with VDDCORE, a gate of M14 is connected with the gate of transistor M4 for receiving input signal AN, a drain of M14 is connected with the drain of M4 at node 13, a gate of M15 is connected with the gate of transistor M5 for receiving input signal AA, and a drain of M15 is connected with the drain of M5 at node 14.

Since transistors M4 and M5 are low voltage devices, they are generally not able to withstand the higher supply voltage VDDIO. Voltage clamp circuit 406 provides a voltage level at nodes 13 and 14 which protects transistors M4 and M5 from damage due to over-voltage stress under essentially all prescribed PVT conditions to which the voltage translator circuit 400 may be subjected. Voltage clamp circuit 406 preferably comprises a pair of high voltage NMOS transistor devices M10 and M11 utilized in a source follower configuration. Specifically, the drains of transistors M4 and M5 are connected with sources of transistors M11 and M10 at nodes 13 and 14, respectively. Drains of transistors M11 and M10 are connected with the drains of transistors M8 and M18 at nodes 12 and 11, respectively, and gates of M10 and M11 are connected with voltage clamp circuit 406 providing a bias voltage, VT2A, for clamping the drain voltage at nodes 13 and 14 to a prescribed voltage level. Bias voltage VT2A, which preferably varies as a function of one or more control signals indicative of an operational mode of the voltage translator circuit 400, may be generated internally to the voltage translator circuit or it may be externally supplied.

Voltage translator circuit 400 comprises an output stage 408 coupled with node I1 and operative to generate the output signal ZV18 which is indicative of a logical state of input signals AN and/or AA. Output stage 408 preferably comprises a high voltage PMOS transistor device M9 and a high voltage NMOS transistor device M17 connected together as a standard inverter referenced to the higher voltage supply VDDIO. More particularly, a source of transistor M9 is connected with VDDIO, a drain of M9 is connected with a drain of transistor M17 to form an output of the voltage translator circuit 400, a source of M17 is connected with VSS, and gates of M9 and M17 are connected to node I1. While the output signal ZV18, in this illustrative embodiment, will be an inversion of the logical state of node other output stage arrangements suitable for use with the invention are similarly contemplated. For example, output stage 408 may be non-inverting, having an input coupled with node 12 and an output for generating signal ZV18. A tri-statable output stage may also be employed which is operative to place the output of the voltage translator circuit 400 in a high-impedance state as a function of a control signal (not explicitly shown).

Voltage translator circuit 400 further comprises a latch circuit 410 coupled with the output of the voltage translator circuit in a feedback configuration and operative to retain the previous state of the output signal ZV18 as a function of one or more control signals, LATCHNIO and LATCHIO, regardless of a state of the core voltage supply. In this manner, when used in a buffer circuit application (e.g., buffer circuit 300 shown in FIG. 3), the voltage translator circuit 400 advantageously enables the buffer circuit to maintain the same number of functional modes when the core voltage supply is powered off as during normal operation of the buffer circuit (i.e., when the core voltage supply is powered on).

Specifically, latch circuit 410 preferably comprises a first high voltage PMOS transistor device M25, a second high voltage PMOS transistor device M26, a first high voltage NMOS transistor device M27 and a second high voltage NMOS transistor device M12 connected in a stacked arrangement with the output stage 408, such as at an input of the output stage at node 11. More particularly, a source of transistor M25 is connected with VDDIO, a drain of M25 is connected with a source of transistor M26, a drain of M26 is connected with the input of output stage 408 at node I1, a drain of transistor M27 is connected with node I1, a source of M27 is connected with a drain of transistor M12, and a source of M12 is connected with VSS. Gates of transistors M25 and M12 are connected with the output of the voltage translator circuit 400 and are operative to receive the output signal ZV18 which is fed back to the latch circuit 410. A gate of transistor M26 is adapted to receive control signal LATCHNIO and a gate of transistor M27 is adapted to receive control signal LATCHIO, which is a logical complement of LATCHNIO. Control signal LATCHIO may be generated internally from signal LATCHNIO, or vice versa, using an inverter (e.g., inverter 320 shown in FIG. 3). It is to be appreciated that latch circuit 410 may be connected to an alternative node in the output stage 408 which similarly serves to define the output signal ZV18 at its previous state.

During normal operation of the voltage translator circuit 400, i.e., when the core voltage supply VDDCORE is powered on and the control signals LATCHNIO and LATCHIO are de-asserted (e.g., LATCHIO is a logic low level and LATCHNIO is a logic high level), when input signal AA is at a logic high level (e.g., 1.0V), transistor M15 is turned off and transistor M5 is turned on, thereby pulling node 14 low (e.g., to about VSS or 0V). Input signal AN, being a logical complement of signal AA, will be low, thereby turning on transistor M14 and pulling node 13 high. With node 14 low, node I1 will also be low, which in turn pulls node 12 high (e.g., to about VDDIO or 1.8V) through transistor M8. Node I1 being low, output stage 408 will generate a logic high output signal ZV18 (e.g., about 1.8V). Similarly, when input signal AA is low, transistor M5 will be turned off and transistor M15 will be turned on, thereby pulling node 14 high (e.g., to about VDDCORE or 1.0V) through M15. Input signal AN, being a logical complement of signal AA, will be high, thereby turning on transistor M4 and pulling node 13 low. With node 13 low, node 12 will also be low, which in turn pulls node I1 high (e.g., to about VDDIO or 1.8V) through transistor M18. Node I1 being high, output stage 408 will generate a logic low output signal ZV18.

When control signals LATCHNIO and LATCHIO are asserted (e.g., LATCHNIO transitions from a high to a low logic state and LATCHIO transitions from a low to a high logic state), transistors M26 and M27 turn on, thereby connecting transistors M25 and M12 in a standard inverter arrangement to node I1. Thus, node I1 will be set either high or low as a function of the previous state of output signal ZV18, which is fed back to the latch circuit 410. Specifically, when output signal ZV18 is a logic low level, transistor M12 turns off and transistor M25 turns on, thereby pulling node 11 to VDDIO (through M25 and M26) and latching the output of the voltage translator circuit 400 at a logic low level (e.g., VSS or 0V) regardless of a state of the core voltage supply VDDCORE. Likewise, when output signal ZV18 is a logic high level, transistor M25 turns off and transistor M12 turns on, thereby pulling node I1 to VSS (through M27 and M12) and latching the output of the voltage translator circuit 400 at a logic high level (e.g., VDDIO or 1.8V) regardless of the state of the core voltage supply.

When control signals LATCHNIO and LATCHIO are asserted, bias signal VT2A is preferably set to zero (e.g., VSS). With bias voltage VT2A set to zero, transistors M10 and M11 will be turned off, thereby disabling the current path between the core transistor devices M4, M5, M14 and M15 in the input stage and the I/O transistor devices M8 and M18.

When used in a buffer circuit application, such as, for example, exemplary buffer circuit 300 shown in FIG. 3, assertion of the LATCHNIO and LATCHIO control signals supplied to voltage translator circuits 310, 312, 314 and 316 configured according to an embodiment of the invention is beneficially used to retain the respective states of the voltage translator circuits, thereby preserving the mode of the buffer circuit to what it was prior to assertion of the LATCHNIO signal. Prior to powering down the core voltage supply, the core voltage level input signals A_i are preferably set into prescribed states so that the buffer circuit 300 remains in a desired mode/state, control signal LATCHNIO is then asserted, and subsequently the core voltage supply is powered off or otherwise disconnected. When powering on the core voltage supply, I/O voltage level control signal LATCHNIO remains asserted, and input signals A_i are set into their respective prescribed states when the core voltage supply is up and stable. At this point, control signal LATCHNIO can be de-asserted and the buffer circuit 300 resumes normal operation.

Since each input connection (e.g., adapted to receive core level input signals A_i) of the buffer circuit (e.g., buffer circuit 300 shown in FIG. 3) preferably passes through a corresponding one of the voltage translator circuits (e.g., 310, 312, 314 and 316 in FIG. 3) formed according to embodiments of the invention, the buffer circuit can be advantageously set into essentially any desired mode even when the core voltage supply is powered down.

In order to prevent nodes 13 and 14 in the input stage of the voltage translator circuit 400 from becoming undefined, thereby potentially damaging input stage transistors M4, M14, M5 and M15, when the core voltage supply is powered off, bias voltage VT2A supplied to clamp circuit 406 is preferably selected so as to set nodes 13 and 14 to a prescribed voltage when the control signal LATCHNIO is asserted. To accomplish this, the illustrative bias circuit 250 depicted in FIG. 2B may be modified, as will be described in further detail below in conjunction with FIG. 5.

Figure 5:
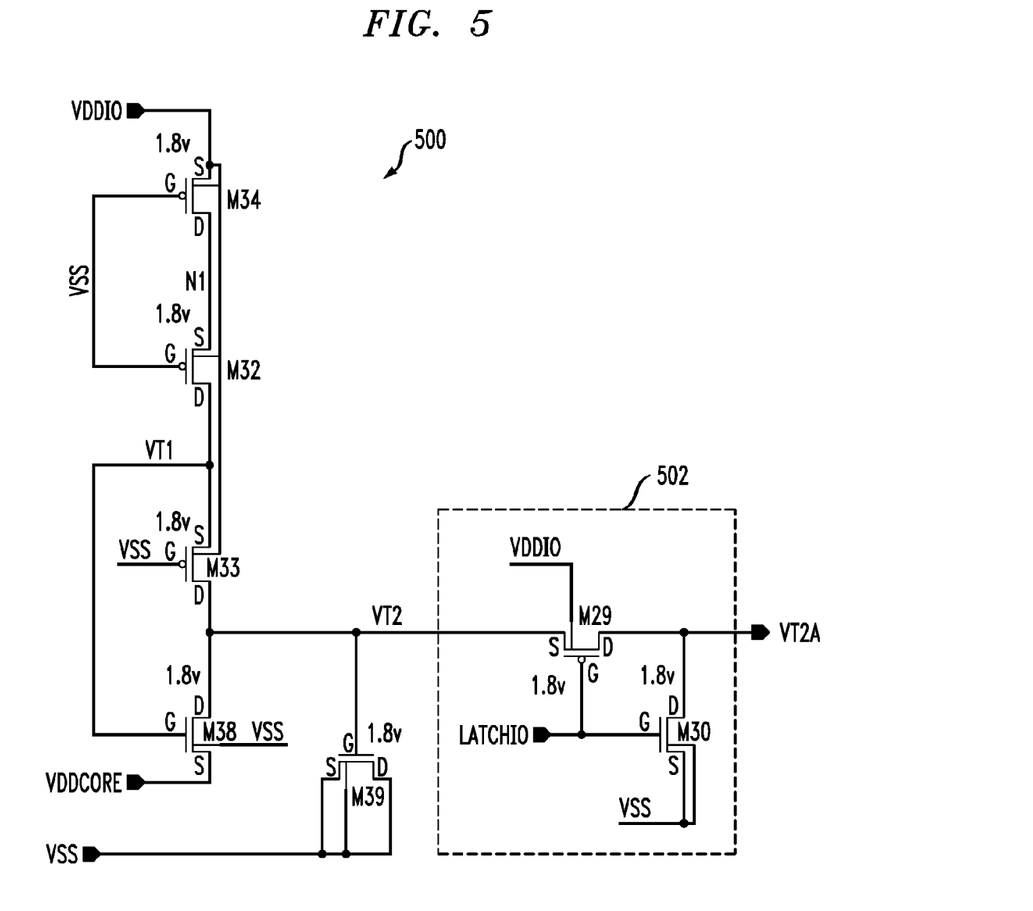
FIG. 5 is an electrical schematic diagram illustrating an exemplary bias generator circuit suitable for use in the voltage level translator circuit shown in FIG. 4, according to an embodiment of the present invention.

FIG. 5 is an electrical schematic diagram illustrating an exemplary bias circuit 500 suitable for use in the voltage translator circuit 400 shown in FIG. 4, according to an embodiment of the present invention. Bias circuit 500 is operative for providing the bias voltage VT2A used to clamp the voltage appearing at nodes 13 and 14 of the voltage translator circuit 400. The bias circuit 500 may be implemented using a simple voltage divider including three high voltage PMOS transistor devices, namely, M32, M33 and M34, and a high voltage NMOS transistor device, M38, arranged in a stacked configuration. Specifically, gates of transistors M32, M33 and M34 are connected with VSS, a source of M34 is connected with VDDIO, a drain of M34 is connected with a source of M32, a drain of M32 is connected with a source of M33, a source of transistor M38 is connected with VDDCORE, and a gate of M38 is connected with a source of M33 at node VT1. A drain of M33 is connected with a drain of M38 at node VT2.

Optionally, a high voltage NMOS transistor device M39 is included in bias circuit 500 and is connected with node VT2 as an MOS capacitor. More particularly, a source and drain of M39 are connected to VSS and a gate of M39 is connected to node VT2. The capacitance provided by M39 may be used to reduce noise which may be introduced into the voltage VT2, and ultimately bias voltage VT2A. The value of this capacitance is preferably chosen as a function of the desired frequency components to be attenuated.

Bias circuit 500 further includes a switching circuit 502 coupled between node VT2 and an output of the bias circuit. Switching circuit 502 is preferably operative in a first mode, which may be considered a normal mode, to connect the output of bias circuit 500 with node VT2. In this mode, the output signal VT2A generated by the bias circuit will be substantially the same as the voltage at node VT2. Switching circuit 502 is preferably operative in at least a second mode, which may be considered a latched mode, to connect the output of the bias circuit with VSS. In this mode, the output signal VT2A generated by the bias circuit will be set to about VSS (i.e., logic low level or 0V).

More particularly, switching circuit 502 preferably comprises a high voltage PMOS transistor device M29 and a high voltage NMOS transistor device M30. A source of transistor M29 is connected with node VT2, a source of transistor M30 is connected with VSS, gates of M29 and M30 are connected together and adapted to receive a control signal, LATCHIO, supplied thereto, and drains of M29 and M30 are connected together and form the output of the bias circuit 500 for generating output signal VT2A. The particular mode of operation of the bias circuit 500 is preferably controlled as a function of the signal LATCHIO. In the first mode of operation, signal LATCHIO is de-asserted (e.g., logic low level), transistor M29 is turned on and transistor M30 is turned off, thereby connecting the output of the bias circuit 500 to node VT2. In the second mode of operation, signal LATCHIO is asserted (e.g., logic high level), transistor M29 is turned off and transistor M30 is tuned on, thereby disconnecting the output of the bias circuit 500 from node VT2 and forcing the output (and thus bias voltage VT2A) to VSS (e.g., ground or 0V).

When the control signal LATCHNIO is asserted and the buffer circuit (e.g., buffer circuit 400 shown in FIG. 4) is latched, the bias circuit 500 operative to generate bias signal VT2A will consume a small amount of DC current, but the voltage translator circuits (e.g., 310, 312, 314 and 316) in the buffer circuit do not consume any significant DC current. In accordance with another embodiment of the invention, in order to reduce the current consumption in the bias circuit 500 when the buffer circuit is latched (e.g., when control signal LATCHNIO is asserted), transistors M34 and M32 in bias circuit 500 could be gated through the LATCHIO signal, such as, for example, by connecting the gates of M34 and M32 to LATCHIO rather to VSS. In this manner, when control signal LATCHIO and LATCHNIO are asserted, transistors M34 and M32 will be turned off, thereby disabling the current path through bias circuit 500.

While illustrative embodiments of a buffer circuit of the present invention have been shown and described herein comprising a voltage translator circuit including NMOS and PMOS transistor devices, it is to be appreciated that, according to alternative embodiments of the invention, one or more PMOS transistor devices may be substituted for one or more NMOS transistor devices, and vice versa, (not explicitly shown), and portions of the voltage translator circuit and/or buffer circuit modified accordingly, as will be understood by those skilled in the art.

At least a portion of the techniques of the present invention may be implemented in one or more ICs. In forming ICs, die are typically fabricated in a repeated pattern on a surface of a semiconductor wafer. Each of the die includes a device described herein, and may include other structures or circuits. Individual die are cut or diced from the wafer, then packaged as integrated circuits. One skilled in the art would know how to dice wafers and package die to produce integrated circuits. Integrated circuits so manufactured are considered part of this invention.

An IC in accordance with embodiments of the present invention can be employed in essentially any application and/or electronic system. Suitable systems for implementing aspects of the invention may include, but are not limited to, personal computers, communication networks, portable communications devices (e.g., cell phones), solid-state media storage devices, etc. Systems incorporating such integrated circuits are considered part of this invention. Given the teachings of the invention provided herein, one of ordinary skill in the art will be able to contemplate other implementations and applications of the techniques of the invention.

Although illustrative embodiments of the invention have been described herein with reference to the accompanying drawings, it is to be understood that the invention is not limited to those precise embodiments, and that various other changes and modifications may be made therein by one skilled in the art without departing from the scope of the appended claims.

What is claimed:

1. A voltage translator circuit, comprising:
an input stage adapted for receiving an input signal referenced to a first voltage supply;
a first latch circuit adapted for connection with a second voltage supply and operative to at least temporarily store a logic state of the input signal;
a voltage clamp coupled between the input stage and the first latch circuit, the voltage clamp being operative to set a maximum voltage across the input stage to a prescribed level, the voltage translator circuit generating a first output signal at a first output formed at a junction between the first latch circuit and the voltage clamp; and
a second latch circuit connected to the first output in a feedback configuration, the second latch circuit being operative to retain a logical state of the first output signal as a function of at least a first control signal supplied to the second latch circuit regardless of a state of the first voltage supply;
wherein the voltage clamp is adapted to receive a first bias signal for setting the maximum voltage across the input stage, the first bias signal varying as a function of the first control signal.

2. The voltage translator circuit of claim 1, wherein the input stage comprises low voltage transistors and each of the first and second latch circuits and the voltage clamp comprises high voltage transistors.

3. The voltage translator circuit of claim 1, wherein the input stage comprises a differential input stage.

4. The voltage translator circuit of claim 1, wherein the input stage comprises first and second NMOS transistors, a first source/drain of the first and second NMOS transistors being adapted for connection with a voltage return of the voltage translator circuit, a second source/drain of the first NMOS transistor being connected with a first node of the voltage clamp, a second source/drain of the second NMOS transistor being connected with a second node of the voltage clamp, a gate of the first NMOS transistor adapted for receiving a first signal indicative of a logical complement of the input signal, and a gate of the second NMOS transistor adapted for receiving a second signal indicative of the input signal.

5. The voltage translator circuit of claim 4, wherein the input stage further comprises first and second PMOS transistors, a first source/drain of the first and second PMOS transistors being adapted for connection with the first voltage supply, a second source/drain of the first PMOS transistor being connected with the first node of the voltage clamp, a second source/drain of the second PMOS transistor being connected with the second node of the voltage clamp, a gate of the first PMOS transistor being connected with the gate of the first NMOS transistor, and a gate of the second PMOS transistor being connected with the gate of the second NMOS transistor.

6. The voltage translator circuit of claim 1, wherein the first latch circuit comprises first and second PMOS transistors, a first source/drain of the first and second PMOS transistors being adapted for connection with the second voltage supply, a second source/drain of the first PMOS transistor being connected with the voltage clamp at a first node, a second source/drain of the second PMOS transistor being connected with the voltage clamp at a second node, a gate of the first PMOS transistor being connected to the second node, and a gate of the second PMOS transistor being connected to the first node.

7. The voltage translator circuit of claim 1, wherein the voltage clamp comprises first and second NMOS transistors, a first source/drain of the first and second NMOS transistors being connected to first and second nodes, respectively, of the latch, a second source/drain of the first NMOS transistor being connected with the input stage at a third node, a second source/drain of the second NMOS transistor being connected with the input stage at a fourth node, and gates of the first and second NMOS transistors being connected together and adapted to receive a first bias signal.

8. The voltage translator circuit of claim 7, wherein the first bias signal is selected such that one or more transistors in the input stage are protected from damage due to over-voltage stress under prescribed process, voltage and temperature conditions to which the voltage translator circuit may be subjected.

9. A voltage translator circuit, comprising:
an input stage adapted for receiving an input signal referenced to a first voltage supply;
a first latch circuit adapted for connection with a second voltage supply and operative to at least temporarily store a logic state of the input signal;
a voltage clamp coupled between the input stage and the first latch circuit, the voltage clamp being operative to set a maximum voltage across the input stage to a prescribed level, the voltage translator circuit generating a first output signal at a first output formed at a junction between the first latch circuit and the voltage clamp; and
a second latch circuit connected to the first output in a feedback configuration, the second latch circuit being operative to retain a logical state of the first output signal as a function of at least a first control signal supplied to the second latch circuit regardless of a state of the first voltage supply;
wherein the voltage clamp comprises first and second NMOS transistors, a first source/drain of the first and second NMOS transistors being connected to first and second nodes, respectively, of the latch, a second source/drain of the first NMOS transistor being connected with the input stage at a third node, a second source/drain of the second NMOS transistor being connected with the input stage at a fourth node, and gates of the first and second NMOS transistors being connected together and adapted to receive a first bias signal, wherein the first bias signal varies as a function of the first control signal.

10. The voltage translator circuit of claim 1, further comprising at least a first output buffer operative to receive the first output signal and to generate a first buffered output signal indicative thereof, the first buffered output signal being referenced to the second voltage supply.

11. The voltage translator circuit of claim 1, wherein the second latch circuit comprises first and second PMOS transistors and first and second NMOS transistors, a first source/drain of the first PMOS transistor being adapted for connection with the second voltage supply, a second source/drain of the first PMOS transistor being connected with a first source/ drain of the second PMOS transistor, a second source/drain of the second PMOS transistor being connected with the first output, a first source/drain of the first NMOS transistor being connected with the first output, a second source/drain of the first transistor being connected with a first source/drain of the second NMOS transistor, a second source/drain of the second NMOS transistor being adapted for connection with a voltage return of the voltage translator circuit, gates of the first PMOS transistor and the second NMOS transistor being connected together and adapted to receive a logical complement of the first output signal, a gate of the second PMOS transistor being adapted to receive the first control signal, and a gate of the first NMOS transistor being adapted to receive a logical complement of the first control signal.

12. The voltage translator circuit of claim 1, further comprising an output stage having an input coupled with the first output of the voltage translator circuit, the output stage being operative to generate a second output signal at a second output of the voltage translator circuit which is indicative of the first output signal.

13. The voltage translator circuit of claim 12, wherein the output stage comprises a PMOS transistor and an NMOS transistor connected together as an inverter referenced to the second voltage supply, an input of the inverter being connected with the first output of the of the voltage translator circuit and an output of the inverter being connected with the second output of the voltage translator circuit.

14. A voltage translator circuit, comprising:
an input stage adapted for receiving an input signal referenced to a first voltage supply;
a first latch circuit adapted for connection with a second voltage supply and operative to at least temporarily store a logic state of the input signal;
a voltage clamp coupled between the input stage and the first latch circuit, the voltage clamp being operative to set a maximum voltage across the input stage to a prescribed level, the voltage translator circuit generating a first output signal at a first output formed at a junction between the first latch circuit and the voltage clamp;
a second latch circuit connected to the first output in a feedback configuration, the second latch circuit being operative to retain a logical state of the first output signal as a function of at least a first control signal supplied to the second latch circuit regardless of a state of the first voltage supply; and
a bias circuit coupled with the voltage clamp, the bias circuit comprising:
a voltage divider circuit coupled between the first and second voltage supplies and operative to generate a first bias voltage at a first node; and
a switching circuit coupled between the first node and an output of the bias circuit, the switching circuit being operative in a first mode to generate an output signal that is substantially equal to the first bias voltage, the switching circuit being operative in at least a second mode to connect the output of the bias circuit with a voltage return of the voltage translator circuit to thereby set the output signal substantially equal to zero, a mode of the switching circuit being a function of the first control signal;
wherein the maximum voltage across the input stage set by the voltage clamp is a function of the output signal.

15. The voltage translator circuit of claim 1, wherein at least a portion of the voltage translator circuit is formed in at least one integrated circuit.

16. A buffer circuit, comprising:
a plurality of voltage translator circuits operative to receive respective input signals referenced to a first voltage supply and to generate corresponding first output signals referenced to a second voltage supply, the second voltage supply powering the buffer circuit, each of the voltage translator circuits comprising at least one latch circuit operative to retain a logical state of the first output signal generated by the voltage translator circuit as a function of at least a first control signal supplied to the voltage translator circuit regardless of a state of the first voltage supply;
logic circuitry coupled with the plurality of voltage translator circuits, the logic circuitry being operative to receive the first output signals generated by the respective voltage translator circuits and to set an operational mode of the buffer circuit as a function of respective logical states of the first output signals; and
an output stage adapted for connection between the logic circuitry and an input/output pad, the output stage being operative to receive at least a second control signal generated by the logic circuitry and to generate a second output signal as a function of the second control signal for driving the input/output pad;
wherein each of at least a subset of the plurality of voltage translator circuits is operative to receive a first bias signal for setting a maximum voltage across an input stage of the voltage translator circuit, the first bias signal varying as a function of the first control signal.

17. The buffer circuit of claim 16, wherein each of at least a subset of the plurality of voltage translator circuits comprises:
an input stage adapted for receiving a corresponding one of the input signals referenced to the first voltage supply;
a first latch circuit adapted for connection with the second voltage supply and operative to at least temporarily store a logic state of the corresponding one of the input signals;
a voltage clamp coupled between the input stage and the first latch circuit, the voltage clamp being operative to set a maximum voltage across the input stage to a prescribed level, the voltage translator circuit generating the corresponding first output signal at a first output formed at a junction between the first latch circuit and the voltage clamp; and
a second latch circuit connected to the first output in a feedback configuration, the second latch circuit being operative to retain a logical state of the first output signal as a function of at least the first control signal supplied to the second latch circuit regardless of the state of the first voltage supply.

18. A buffer circuit, comprising:
a plurality of voltage translator circuits operative to receive respective input signals referenced to a first voltage supply and to generate corresponding first output signals referenced to a second voltage supply, the second voltage supply powering the buffer circuit, each of the voltage translator circuits comprising at least one latch circuit operative to retain a logical state of the first output signal generated by the voltage translator circuit as a function of at least a first control signal supplied to the voltage translator circuit regardless of a state of the first voltage supply;
logic circuitry coupled with the plurality of voltage translator circuits, the logic circuitry being operative to receive the first output signals generated by the respective voltage translator circuits and to set an operational mode of the buffer circuit as a function of respective logical states of the first output signals; and an output stage adapted for connection between the logic circuitry and an input/output pad, the output stage being operative to receive at least a second control signal generated by the logic circuitry and to generate a second output signal as a function of the second control signal for driving the input/output pad;

wherein each of at least a subset of the plurality of voltage translator circuits comprises:

an input stage adapted for receiving a corresponding one of the input signals referenced to the first voltage supply;

a first latch circuit adapted for connection with the second voltage supply and operative to at least temporarily store a logic state of the corresponding one of the input signals;

a voltage clamp coupled between the input stage and the first latch circuit, the voltage clamp being operative to set a maximum voltage across the input stage to a prescribed level, the voltage translator circuit generating the corresponding first output signal at a first output formed at a junction between the first latch circuit and the voltage clamp;

a second latch circuit connected to the first output in a feedback configuration, the second latch circuit being operative to retain a logical state of the first output signal as a function of at least the first control signal supplied to the second latch circuit regardless of the state of the first voltage supply; and a bias circuit coupled with the voltage clamp, the bias circuit comprising:

a voltage divider circuit coupled between the first and second voltage supplies and operative to generate a first bias voltage at a first node; and a switching circuit coupled between the first node and an output of the bias circuit, the switching circuit being operative in a first mode to generate an output signal that is substantially equal to the first bias voltage, the switching circuit being operative in at least a second mode to connect the output of the bias circuit with a voltage return of the voltage translator circuit to thereby set the output signal substantially equal to zero, a mode of the switching circuit being a function of the first control signal;

wherein the maximum voltage across the input stage set by the voltage clamp is a function of the output signal.

19. The buffer circuit of claim 16, wherein the output stage comprises at least a first pull-up device adapted for connection between the second voltage supply and the input/output pad, and at least one pull-down device adapted for connection between the input/output pad and a voltage return of the buffer circuit.

20. The buffer circuit of claim 16, wherein at least a portion of the buffer circuit is formed in at least one integrated circuit.

21. An electronic system, comprising:

at least one integrated circuit adapted to perform voltage level translation, the at least one integrated circuit including at least one voltage translator circuit comprising:

an input stage adapted for receiving an input signal referenced to a first voltage supply;

a first latch circuit adapted for connection with a second voltage supply and operative to at least temporarily store a logic state of the input signal;

a voltage clamp coupled between the input stage and the first latch circuit, the voltage clamp being operative to set a maximum voltage across the input stage to a prescribed level, the voltage translator circuit generating a first output signal at a first output formed at a junction between the first latch circuit and the voltage clamp; and a second latch circuit connected to the first output in a feedback configuration, the second latch circuit being operative to retain a logical state of the first output signal as a function of at least a first control signal supplied to the second latch circuit regardless of a state of the first voltage supply;

wherein the voltage clamp is adapted to receive a first bias signal for setting the maximum voltage across the input stage, the first bias signal varying as a function of the first control signal.

* * * * *